(12) United States Patent
Hirano et al.

(10) Patent No.: US 10,299,387 B2
(45) Date of Patent: May 21, 2019

(54) SUBSTRATE ON WHICH ELECTRONIC COMPONENT IS SOLDERED, ELECTRONIC DEVICE, METHOD FOR SOLDERING ELECTRONIC COMPONENT

(71) Applicant: FUJITSU LIMITED, Kawasaki-shi, Kanagawa (JP)

(72) Inventors: Yoshikazu Hirano, Yokohama (JP); Kinuko Mishiro, Kawasaki (JP); Toru Okada, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 1 day.

(21) Appl. No.: 15/984,458

(22) Filed: May 21, 2018

(65) Prior Publication Data
US 2018/0343748 A1 Nov. 29, 2018

(30) Foreign Application Priority Data
May 23, 2017 (JP) .................. 2017-101594

(51) Int. Cl.
| H05K 1/18 | (2006.01) |
| H05K 3/30 | (2006.01) |
| H05K 3/34 | (2006.01) |
| H05K 1/11 | (2006.01) |
| H05K 3/42 | (2006.01) |

(52) U.S. Cl.
CPC .......... *H05K 3/3447* (2013.01); *H05K 1/116* (2013.01); *H05K 1/184* (2013.01); *H05K 3/306* (2013.01); *H05K 3/3452* (2013.01); *H05K 3/422* (2013.01); *H05K 3/423* (2013.01); *H05K 2201/0959* (2013.01); *H05K 2201/09572* (2013.01); *H05K 2201/09636* (2013.01); *H05K 2203/044* (2013.01); *H05K 2203/045* (2013.01); *H05K 2203/072* (2013.01); *H05K 2203/0723* (2013.01)

(58) Field of Classification Search
CPC ........ H05K 1/184; H05K 3/306; H05K 3/306; H05K 3/308
See application file for complete search history.

(56) References Cited

U.S. PATENT DOCUMENTS 7,273,988 B2 * 9/2007 Momokawa ........... H05K 3/306
                                                174/260
2007/0029108 A1    2/2007 Nakao et al.

FOREIGN PATENT DOCUMENTS

| JP | 02-13770 U | 1/1990 |
| JP | 05-72176 U | 9/1993 |
| JP | 2004-273990 | 9/2004 |
| JP | 2007-42995 | 2/2007 |

* cited by examiner

*Primary Examiner* — Jeremy C Norris
(74) *Attorney, Agent, or Firm* — Fujitsu Patent Center

(57) ABSTRACT

A substrate on which an electronic component is soldered, includes an electronic component, a through hole positioned on the substrate and passing through the substrate, a solder that joins the through hole and a terminal of the electronic component inserted in the through hole, a pattern formed on a first surface of the substrate, the first surface facing a second surface on which the electronic component is placed, a first resist superimposed on the pattern, an exposed portion of which the pattern is exposed from the first resist around the through hole, and a second resist superimposed on the pattern and arranged between the through hole and the exposed portion.

5 Claims, 15 Drawing Sheets

FIG. 7

|  | COMPARATIVE EXAMPLE | EXAMPLE 1 |
|---|---|---|
| MAXIMUM VALUE | 71% | 99% |
| AVERAGE VALUE | 58% | 87% |
| MINIMUM VALUE | 48% | 75% |

US 10,299,387 B2

SUBSTRATE ON WHICH ELECTRONIC COMPONENT IS SOLDERED, ELECTRONIC DEVICE, METHOD FOR SOLDERING ELECTRONIC COMPONENT

CROSS-REFERENCE TO RELATED APPLICATION

This application is based upon and claims the benefit of priority of the prior Japanese Patent Application No. 2017-101594, filed on May 23, 2017, the entire contents of which are incorporated herein by reference.

FIELD

The embodiments discussed herein are related to a substrate on which an electronic component is soldered, an electronic device, a method for soldering an electronic component.

BACKGROUND

As illustrated in FIG. 13A, a lead terminal 202 of an electronic component 201 is inserted into a through hole 102 of a printed substrate 101 and the printed substrate 101 passes through a surface of a molten solder 301 to solder the electronic component 201 soldered to the printed substrate 101. Such soldering is called flow soldering. As the molten solder 301 rises inside the through hole 102 and the molten solder 301 is cooled, as illustrated in FIG. 13B, a solder 302 is formed inside the through hole 102, and the lead terminal 202 of the electronic component 201 is soldered to the through hole 102. A state in which the molten solder 301 rises inside the through hole 102 is referred to as molten soldering.

In the recent years, from the viewpoint of environmental problems, lead-free solder is used in place of lead-containing solder. Since a melting point of the lead-free solder is higher than the melting point of the lead-containing solder, soldering using lead-free solder is performed at a temperature higher than a soldering temperature using the lead-containing solder. In a case where a large-size component is soldered to the substrate, since the large-size component easily absorbs heat, the heat of the molten solder is absorbed by the large-size component. A wiring pattern (solid pattern) is formed on the surface of the substrate by etching copper foil provided on the surface of the substrate. In addition, in a case where a substrate is formed by stacking insulating layers on which wiring patterns are formed, the wiring pattern is provided inside the substrate. Since a thermal conductivity of the copper foil is high and the wiring pattern is arranged spreading in a planar direction of the substrate, the heat of the substrate is radiated through the wiring pattern. In a case where the wiring pattern is arranged in a vicinity of the through hole, the heat of the molten solder is absorbed by the wiring pattern. When the temperature of the molten solder decreases, a fluidity of the molten solder decreases and the molten soldering is inhibited. When the molten soldering is inhibited, there is a possibility that the surface of the substrate and the lead terminal of the electronic component are soldered in an insufficient state.

There are attempts to improve the molten soldering by changing the process such as raising the heating temperature of the solder or prolonging a heating time of the solder. Since it is possible to change the process by changing a setting of a heating device, implementation is easy. However, since the temperature of the other components around the through hole and the substrate further increases, other parts and the substrate may be destroyed.

There are attempts to improve the molten soldering by changing the design of the substrate. As the changing the design of the substrate, there are, (1) Enlargement of the diameter of the hole of the through hole, (2) Deleting of the connection portion between the wiring pattern and the through hole, and (3) Deleting of the wiring pattern itself, for example.

However, even when the diameter of the hole of the through hole is enlarged or the connecting portion between the wiring pattern and the through hole is deleted, the molten soldering hardly improves. In addition, when connecting portion between the wiring pattern and the through hole is deleted or wiring pattern itself is deleted, the electric characteristics of the substrate may be deteriorated.

There are attempts to improve the molten soldering by soldering the components to the substrate using the solder having a low melting point. For example, the molten soldering is improved by soldering the component to the substrate, using solder having a melting point of 140° C. from a solder having a melting point of 220° C. However, the solder having the low melting point tends to be inferior in connection reliability against vibrations, impacts, and the like.

The followings are reference documents.
[Document 1] Japanese Laid-open Patent Publication No. 2004-273990,
[Document 2] Japanese Laid-open Patent Publication No. 2007-42995,
[Document 3] Japanese Unexamined Utility Model Registration Application Publication No. 2-13770 and
[Document 4] Japanese Unexamined Utility Model Registration Application Publication No. 5-72176.

SUMMARY

According to an aspect of the invention, a substrate on which an electronic component is soldered, includes an electronic component, a through hole positioned on the substrate and passing through the substrate, a solder that joins the through hole and a terminal of the electronic component inserted in the through hole, a pattern formed on a first surface of the substrate, the first surface facing a second surface on which the electronic component is placed, a first resist superimposed on the pattern, an exposed portion of which the pattern is exposed from the first resist around the through hole, and a second resist superimposed on the pattern and arranged between the through hole and the exposed portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a diagram illustrating a measurement result of a molten soldering rate of a through hole of a printed substrate according to Example 1 and a measurement result of a molten soldering rate of a through hole of a printed substrate according to a comparative example;

DESCRIPTION OF EMBODIMENTS

Hereinafter, embodiments will be described in detail with reference to drawings. A configuration of the following embodiments is an example, and the exemplary embodiment is not limited to the configuration of the embodiment.

Figure 1:
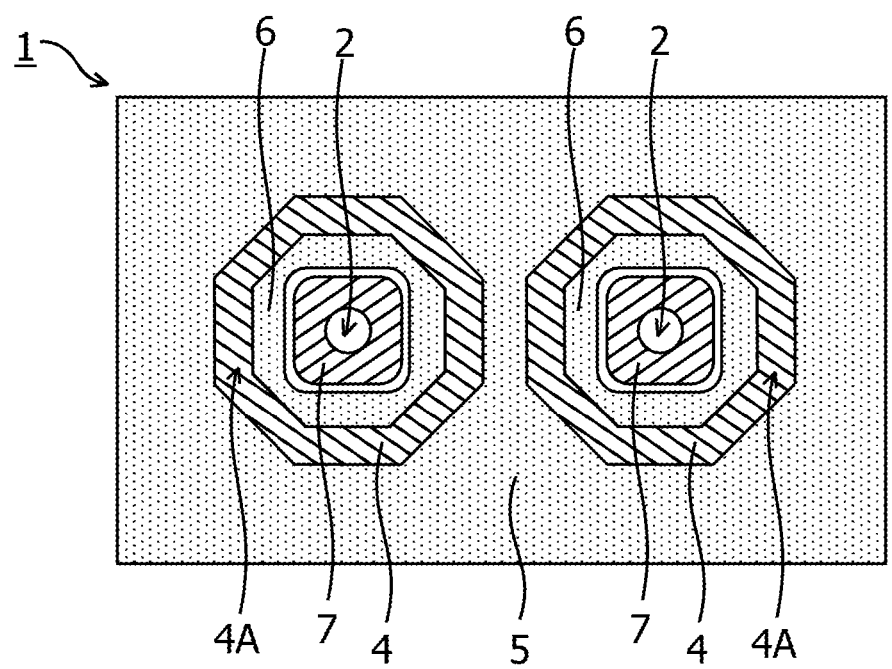
FIG. 1 is a plan view of a printed substrate.
Figure 2:
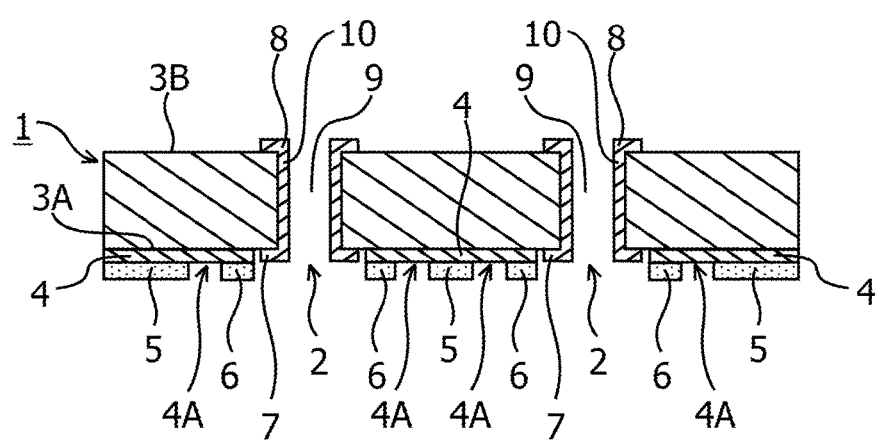
FIG. 2 is a cross-sectional view of the printed substrate.

FIG. 1 is a plan view of a printed substrate (circuit wiring substrate) 1. FIG. 2 is a cross-sectional view of the printed substrate 1. The printed substrate 1 includes a through hole 2 provided in the printed substrate 1, a pattern 4 formed on a first surface (lower surface) 3A of the printed substrate 1, and solder resists 5 and 6 superimposed on the pattern 4. The printed substrate 1 is provided with one or a plurality of through holes 2. The printed substrate 1 illustrated in FIGS. 1 and 2 is a structure in which a plurality of prepregs (insulating layers) are stacked. However, it is not limited to the example of the structure of the printed substrate 1 illustrated in FIGS. 1 and 2, and the printed substrate 1 may be a single layer. The printed substrate 1 is an example of a substrate.

The through hole 2 penetrates the printed substrate 1 and has an opening in the first surface 3A and a second surface (upper surface) 3B of the printed substrate 1. The second surface 3B of the printed substrate 1 is a surface facing the first surface 3A of the printed substrate 1. Lands 7 and 8 are provided around the opening of the through hole 2. The land 7 is provided on the first surface 3A of the printed substrate 1 and the land 8 is provided on the second surface 3B of the printed substrate 1. The through hole 2 has a hole 9 formed in the printed substrate 1 and a plating 10 formed on the inner peripheral surface of the hole 9. The plating 10 is connected to the lands 7 and 8, and electrically connects the lands 7 and 8.

The pattern 4 is a member with thermal conductivity. An example of a member with thermal conductivity includes copper foil. The pattern 4 extends in a planar direction of the printed substrate 1. Solder resists 5 and 6 overlap with the pattern 4. The solder resists 5 and 6 are protective films for protecting the pattern 4. The solder resists 5 and 6 are formed of, for example, an epoxy resin. The material of the solder resists 5 and 6 is not limited to the epoxy resin and may be other resin. The solder resist 5 extends to the printed substrate 1 in the planar direction. The solder resist 5 is an example of a first resist. The solder resist 6 is an example of a second resist.

A part of the pattern 4 around the through hole 2 is exposed from the solder resists 5 and 6. That is, the pattern 4 includes an exposed portion 4A in which the pattern 4 is exposed from the solder resist 5 around the through hole 2. The exposed portion 4A of the pattern 4 has a frame shape in a plan view from a normal direction of the first surface 3A of the printed substrate 1. The outer peripheral portion and the inner peripheral portion of the frame shape may be, for example, a rectangle, a polygon, a circle, or an ellipse. The exposed portion 4A of the pattern 4 may have a rectangular shape, a polygonal shape, a circular shape, an elliptical shape in a plan view from the normal direction of the first surface 3A of the printed substrate 1, and may have the other shapes. The solder resist 6 is disposed between the through hole 2 and the exposed portion 4A of the pattern 4. The solder resist 6 has the frame shape in a plan view from the normal direction of the first surface 3A of the printed substrate 1. The solder resist 6 may have a rectangular shape, a polygonal shape, a circular shape, an elliptical shape in a plan view from the normal direction of the first surface 3A of the printed substrate 1, and may have the other shapes.

Figure 3:
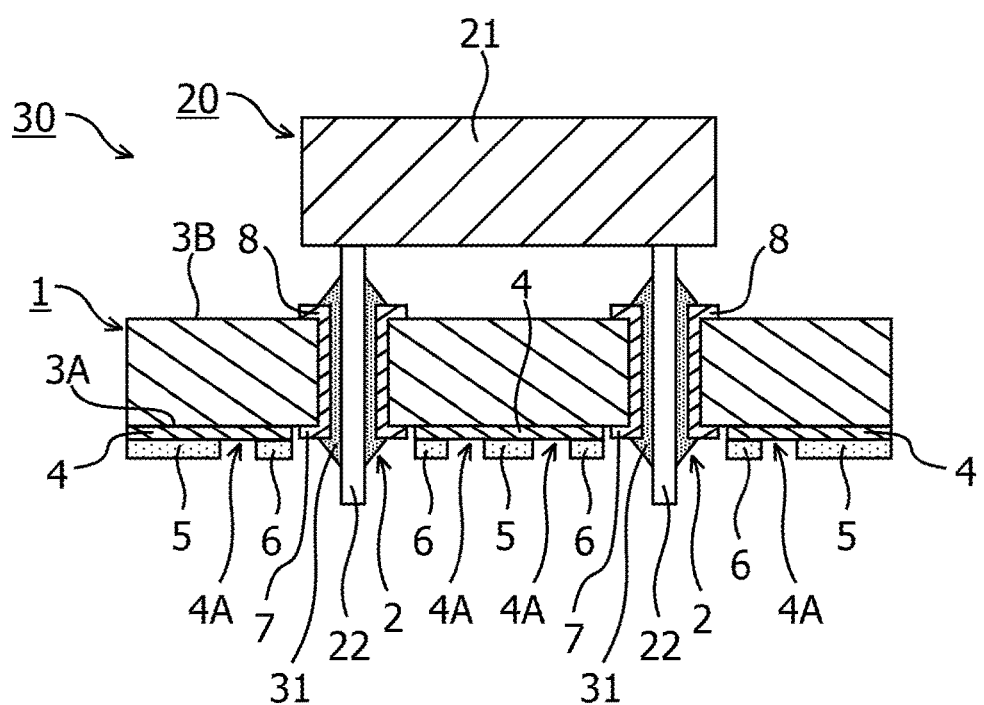
FIG. 3 is a cross-sectional view of an electronic device.

FIG. 3 is a cross-sectional view of an electronic device 30. The electronic device 30 includes the printed substrate 1 and an electronic component 20. As illustrated in FIG. 3, the electronic component 20 is soldered to the printed substrate 1. The electronic component 20 includes a component main body 21 and a lead terminal 22 provided in the component main body 21. The lead terminal 22 of the electronic component 20 is inserted into the through hole 2. The printed substrate 1 includes a solder 31 for joining the lead terminal 22 of the electronic component 20 and the through hole 2. By joining the lead terminal 22 of the electronic component 20 and the through hole 2 with the solder 31, the electronic component 20 is soldered to the printed substrate 1. That is, by soldering the lead terminal 22 of the electronic component 20 to the through hole 2, the electronic component 20 is soldered to the printed substrate 1. The lead terminal 22 is an example of a terminal.

Figure 4:
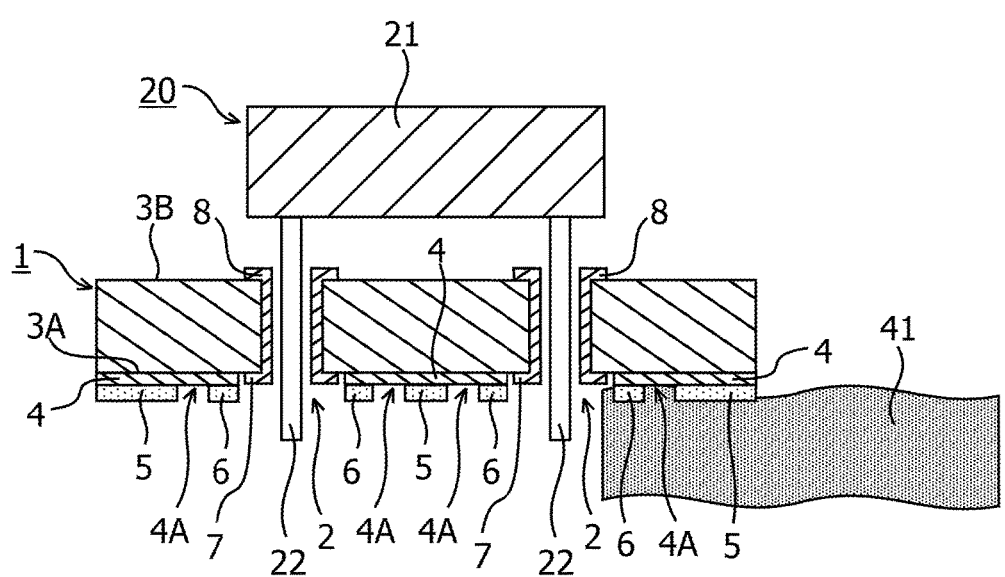
FIG. 4 is a diagram illustrating an example of a process of soldering an electronic component to the printed substrate.

FIG. 4 is a diagram illustrating an example of a process of soldering the electronic component 20 to the printed substrate 1. As illustrated in FIG. 4, the electronic component 20 is placed on the second surface 3B of the printed substrate 1, the lead terminal 22 of the electronic component 20 is inserted into the through hole 2 of the printed substrate 1, and the surface of a molten solder 41 passes through the printed substrate 1, the electronic component 20 is soldered to the printed substrate 1. That is, the first surface 3A of the printed substrate 1 is brought into contact with the molten solder 41, and the lead terminal 22 of the electronic component 20 is soldered to the through hole 2 of the printed substrate 1. When the printed substrate 1 passes through the surface of the molten solder 41, the molten solder 41 brings into contact with the exposed portion 4A of the pattern 4. The heat of the molten solder 41 is transmitted to the inside of the printed substrate 1 via the exposed portion 4A of the pattern 4. Therefore, the temperature in the vicinity of the through hole 2 rises. As a result, the molten solder 41 easily rises inside the through hole 2, and molten soldering on the printed substrate 1 is improved.

When the printed substrate 1 passes through the surface of the molten solder 41, the molten solder 41 brings into contact with the through hole 2 and the lead terminals 22 of the electronic component 20. The heat of the molten solder 41 is transferred to the inside of the printed substrate 1 through the plating 10 of the through hole 2 and the lead terminal 22 of the electronic component 20, and the temperature in the vicinity of the through hole 2 rises. According to the embodiment, when the printed substrate 1 passes through the surface of the molten solder 41, the molten solder 41 brings into contact with the exposed portion 4A of the pattern 4 and brings into contact with the through hole 2 and the lead terminals 22 of the electronic component 20. Therefore, since an entrance (entrance path) of heat to the printed substrate 1 is increased, the molten solder 41 easily rises inside the through hole 2, and the molten soldering on the printed substrate 1 is improved. As described above, according to the printed substrate 1, the molten soldering on the printed substrate 1 may be improved without changing the process (temperature condition), changing the design of the pattern 4, and changing the solder material.

Figure 5:
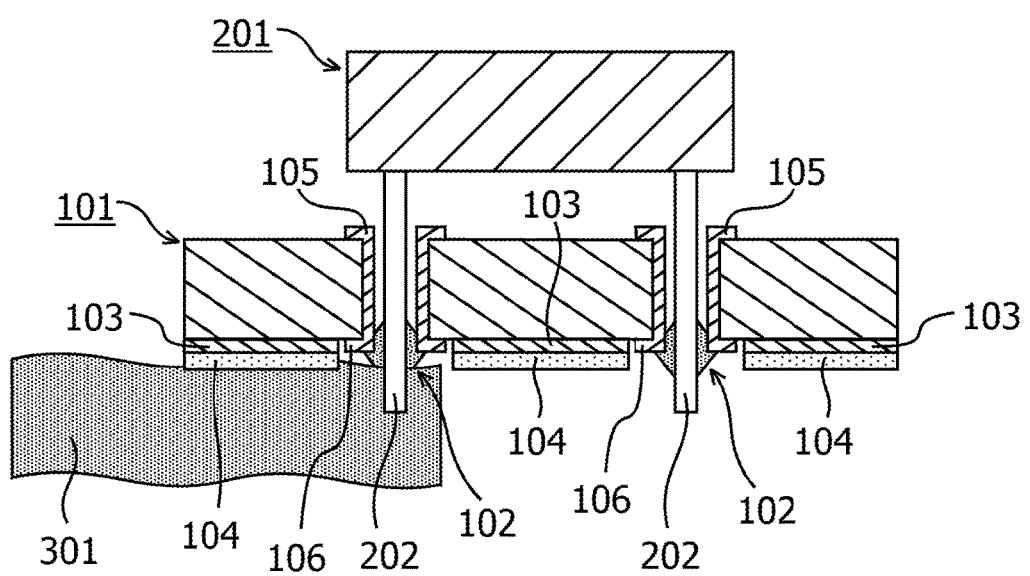
FIG. 5 is a cross-sectional view of a printed substrate according to a comparative example.

FIG. 5 is a cross-sectional view of a printed substrate 101 according to a comparative example. As illustrated in FIG. 5, in the printed substrate 101, a pattern 103 is not exposed from a solder resist 104. Therefore, since the entrance of heat to the printed substrate 101 is only a through hole 102, when the printed substrate 101 passes through the surface of a molten solder 301, the molten solder 301 inside the through hole 102 is not sufficiently raised. As a result, the soldering of an electronic component 201 to the printed substrate 101 becomes insufficient, and there is a possibility that an electrical error may occur between the printed substrate 101 and the electronic component 201.

Figure 6:
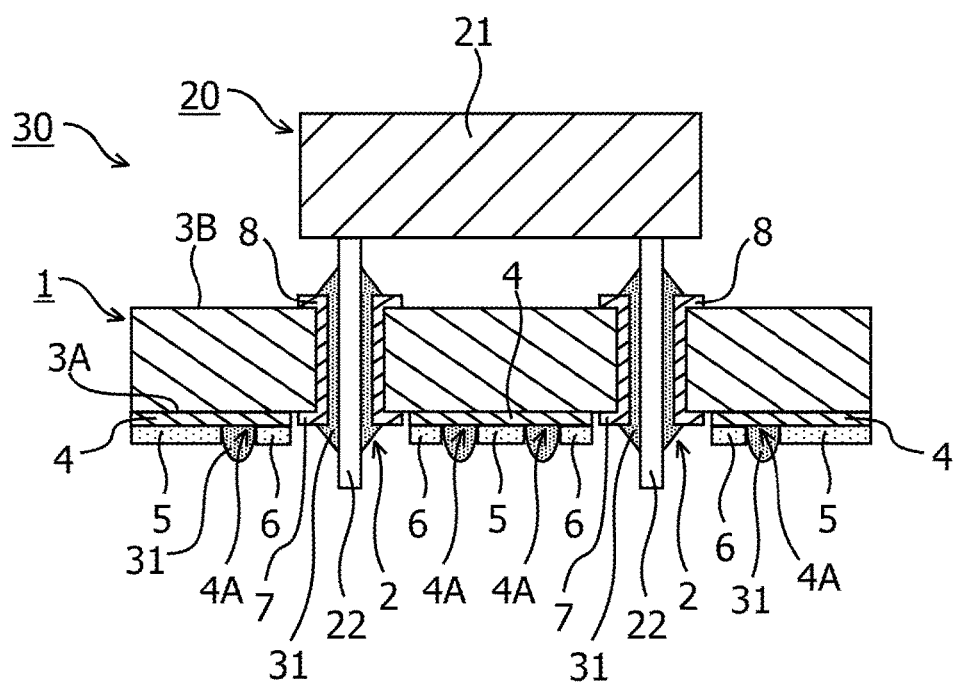
FIG. 6 is a cross-sectional view of the electronic device.

FIG. 6 is a cross-sectional view of the electronic device 30. As the molten solder 41 contacts the exposed portion 4A of the pattern 4, as illustrated in FIG. 6, the solder 31 may be formed on the exposed portion 4A of the pattern 4. When the solder 31 formed in the through hole 2 and the solder 31 formed on the exposed portion 4A of the pattern 4 are connected, the electronic component 20 is insufficiently soldered to the printed substrate 1. Therefore, the electrical error may occur between the printed substrate 1 and the electronic component 20. In the printed substrate 1, the solder resist 6 is disposed between the through hole 2 and the exposed portion 4A of the pattern 4. Therefore, since a short between the solder 31 formed in the through hole 2 and the solder 31 formed on the exposed portion 4A of the pattern 4 is avoided, occurrence of electrical error between the printed substrate 1 and the electronic component 20 is suppressed. In this manner, the solder resist 6 functions as a suppression film for suppressing the connection between the solder 31 formed in the through hole 2 and the solder 31 formed on the exposed portion 4A of the pattern 4.

Measurement Result

FIG. 7 is a diagram illustrating a measurement result of a molten soldering rate of the through hole 2 of the printed substrate 1 according to Example 1 and a measurement result of a molten soldering rate of the through hole 102 of the printed substrate 101 according to a comparative example. The printed substrate 1 according to Example 1 has the same configuration as the printed substrate 1 illustrated in FIGS. 1 to 4. The printed substrate 101 according to the comparative example has the same configuration as the printed substrate 101 illustrated in FIG. 5. The molten soldering rate (%) of the through hole 2 according to Example 1 is a filling rate (%) of the molten solder 41 in the through hole 2. The molten soldering rate (%) of the through hole 102 according to the comparative example is the filling rate (%) of the molten solder 301 in the through hole 102. Regarding the printed substrate 1 according to Example 1, each area of the exposed portion 4A of the pattern 4 is about 33 mm². A plurality of test element group (TEG) substrates having the same configuration as the printed substrate 1 according to Example 1 are prepared, and the molten soldering rate of the through hole 2 was measured. Regarding the printed substrate 101 according to the comparative example, the pattern 103 is not exposed from the solder resist 104. The plurality of TEG substrates having the same configuration as the printed substrate 101 according to the comparative example are prepared and the molten soldering rate of the through hole 102 was measured. As illustrated in FIG. 7, the molten soldering rate (%) of the through hole 2 according to Example 1 is improved to about 1.4 to 1.56 times as compared with the molten soldering rate (%) of the through hole 102 according to the comparative example.

The relationship between the area of the exposed portion 4A of the pattern 4 (the exposed area of the pattern 4) and the molten soldering rate of the through hole 2 will be described. The temperatures of the through holes 2 according to Examples 1 to 3 and the through hole 102 according to the comparative example were measured. In the temperature measurement of the through holes 2 according to Examples 1 to 3, after the printed substrate 1 was brought into contact with the surface of the molten solder 41, the time until the surface temperature of the land 8 of the printed substrate 1 reached 220° C. (hereinafter, expressed as "arrival time of Examples 1 to 3") was measured. The temperature measurement was performed by providing a thermocouple on the land 8 of the printed substrate 1. In the temperature measurement of the through hole 102 according to the comparative example, after the printed substrate 101 was brought into contact with the surface of the molten solder 301, the time until the surface temperature of a land 105 of the printed substrate 101 reaches 220° C. (hereinafter, expressed as "arrival time of the comparative example") was measured. The temperature was measured by providing a thermocouple on the land 105 of the printed substrate 101.

Figure 8A:
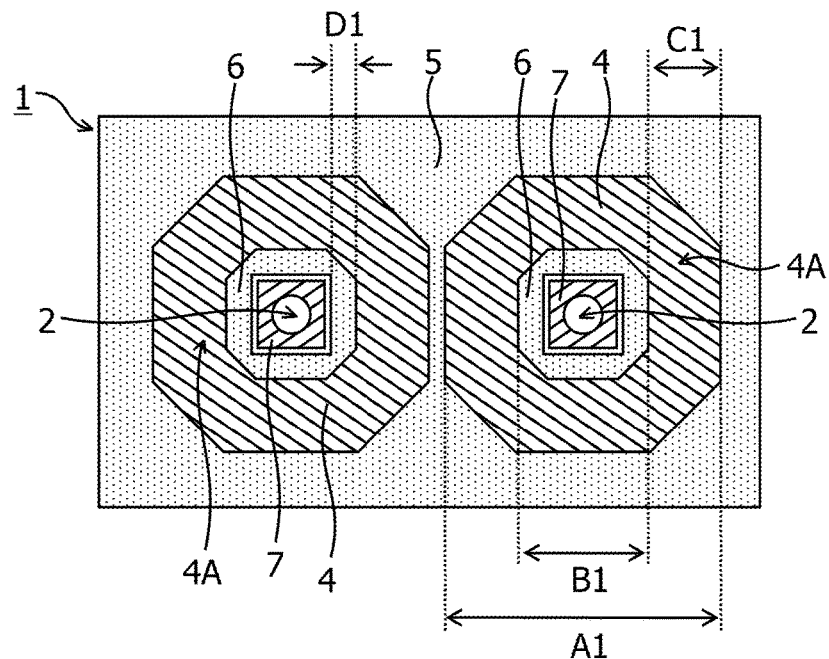
FIG. 8A is a plan view of the printed substrate according to Example 1.

FIG. 8A is a plan view of the printed substrate 1 according to Example 1. For the printed substrate 1 according to Example 1, a diameter of the through hole 2 is Φ1.2 mm, the land 7 has a square shape of 1.85 mm×1.85 mm, and each area of the exposed portion 4A of the pattern 4 is about 33 mm². A width A1 illustrated in FIG. 8A is 7.05 mm, a width B1 illustrated in FIG. 8A is 3.45 mm, a width C1 illustrated in FIG. 8A is 1.8 mm, and a width D1 of the solder resist 6 illustrated in FIG. 8A is in a range of 0.6 mm to 1.0 mm. Since the land 8 is provided on the second surface 3B of the printed substrate 1, the land 8 is omitted in FIG. 8A. Similar to FIG. 8A, the land 8 is not illustrated in FIGS. 8B and 8C.

Figure 8B:
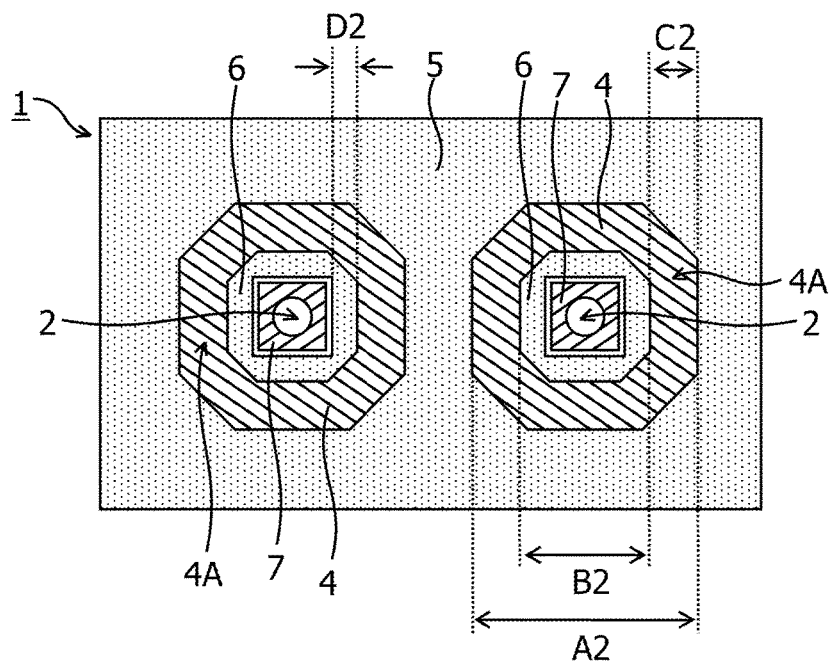
FIG. 8B is a plan view of a printed substrate according to Example 2.

FIG. 8B is a plan view of the printed substrate 1 according to Example 2. For the printed substrate 1 according to Example 2, the diameter of the through hole 2 is Φ1.2 mm, the land 7 has a square shape of 1.85 mm×1.85 mm, and each area of the exposed portion 4A of the pattern 4 is about 19 mm². A width A2 illustrated in FIG. 8B is 5.85 mm, a width B2 illustrated in FIG. 8B is 3.45 mm, a width C2 illustrated in FIG. 8B is 1.2 mm, a width D2 of the solder resist 6 illustrated in FIG. 8B is in a range of 0.6 mm to 1.0 mm.

Figure 8C:
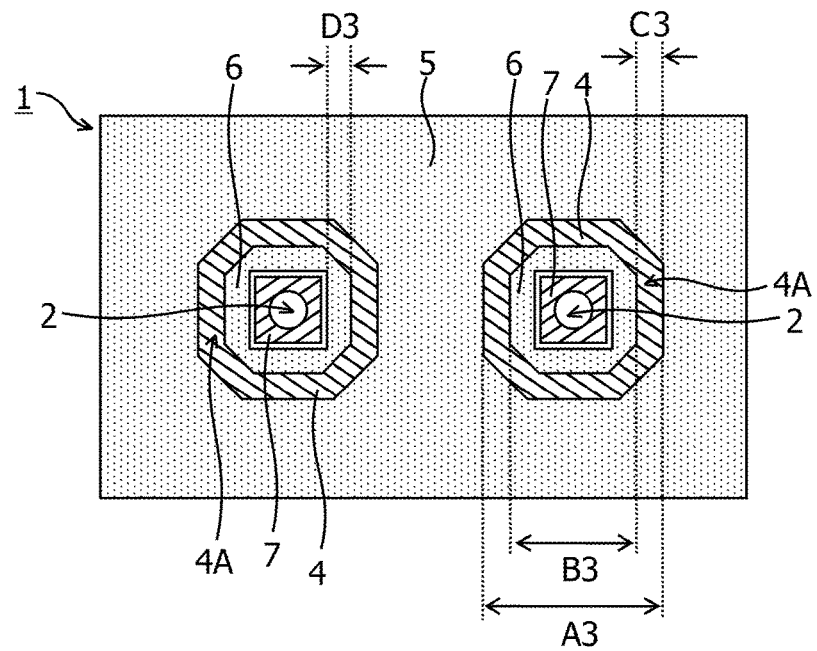
FIG. 8C is a plan view of a printed substrate according to Example 3.
Figure 8D:
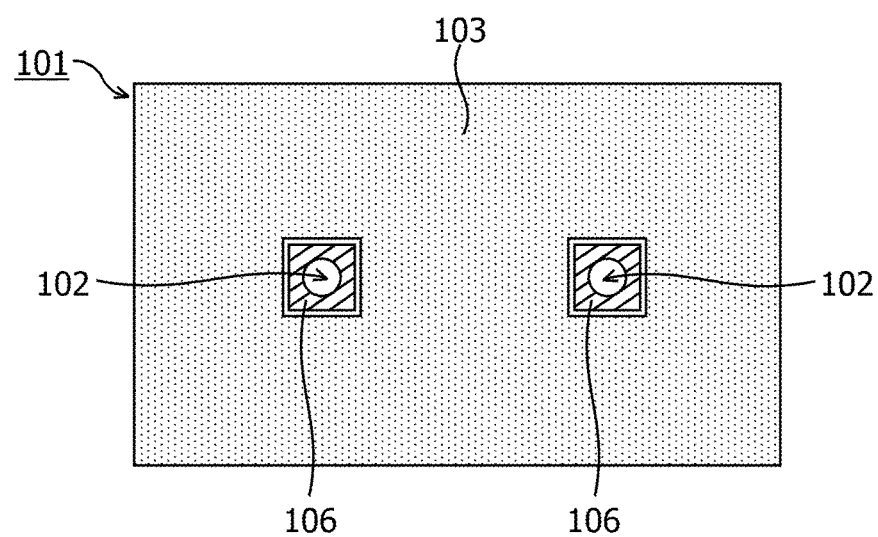
FIG. 8D is a plan view of a printed substrate according to a comparative example.

FIG. 8C is a plan view of the printed substrate 1 according to Example 3. For the printed substrate 1 according to Example 3, the diameter of the through hole 2 is Φ1.2 mm, the land 7 has a square shape of 1.85 mm×1.85 mm, and each area of the exposed portion 4A of the pattern 4 is about 14 mm². A width A3 illustrated in FIG. 8C is 4.65 mm, a width B3 illustrated in FIG. 8C is 3.45 mm, a width C3 illustrated in FIG. 8C is 0.6 mm, a width D3 of the solder resist 6 illustrated in FIG. 8C is in a range of 0.6 mm to 1.0 mm. FIG. 8D is a plan view of the printed substrate 101 according to the comparative example. For the printed substrate 101 according to the comparative example, the diameter of the through hole 102 is Φ1.2 mm, a land 106 has a square shape of 1.85 mm×1.85 mm. Since the land 105 is provided on the surface facing the surface on which the land 106 is provided in the printed substrate 101, the land 105 is omitted in FIG. 8D.

Figure 9A:
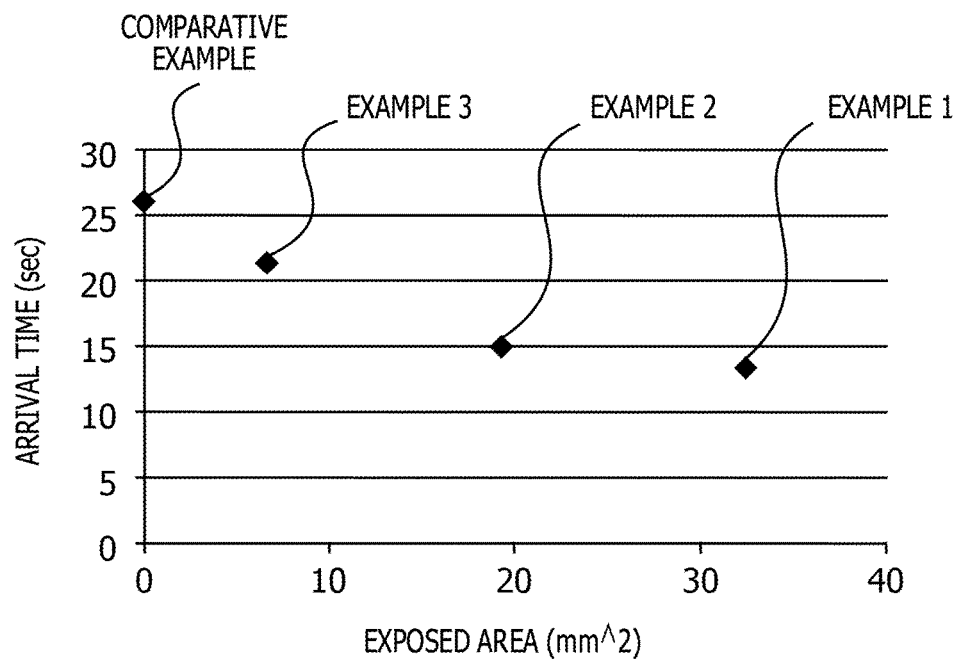
FIG. 9A is a diagram illustrating a relationship between an arrival time and an exposed area.

FIG. 9A is a diagram illustrating the relationship between the arrival time and the exposed area. A vertical axis of FIG. 9A represents the arrival time (sec) of Examples 1 to 3 and the arrival time (sec) of the comparative example. A horizontal axis of FIG. 9A represents the area (mm²) of the exposed portion 4A of the pattern 4 of the printed substrate 1 according to Examples 1 to 3 and the exposed area (mm²) of the pattern 103 of the printed substrate 101 according to the comparative example. As illustrated in FIG. 9A, as the area (mm²) of the exposed portion 4A of the pattern 4 of the printed substrate 1 increases, the time (sec) until the surface temperature of the land 8 of the printed substrate 1 reaches 220° C. is short.

Figure 9B:
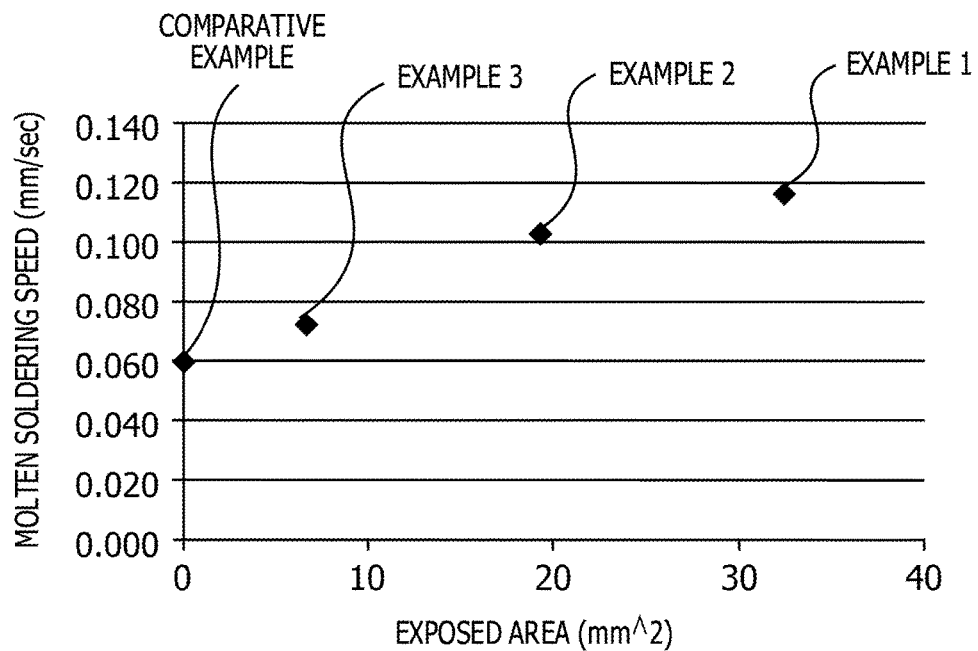
FIG. 9B is a diagram illustrating a relationship between a molten soldering speed and an exposed area.

FIG. 9B is a diagram illustrating the relationship between the molten soldering speed and the exposed area. The vertical axis of FIG. 9B represents the molten soldering speed (mm/sec) of the through holes 2 according to Examples 1 to 3 and the molten soldering speed (mm/sec) of the through hole 102 according to the comparative example. The molten soldering speed (mm/sec) of the through hole 2 according to Example 1 is a value obtained by dividing the thickness (mm) of the printed substrate 1 by the arrival time (sec) of Example 1. The molten soldering speed (mm/sec) of the through hole 102 according to Example 2 is a value obtained by dividing the thickness (mm) of the printed substrate 1 by the arrival time (sec) of Example 2. The molten soldering speed (mm/sec) of the through hole 2 according to Example 3 is a value obtained by dividing the thickness (mm) of the printed substrate 1 by the arrival time (sec) of Example 3. The molten soldering speed (mm/sec) of the through hole 102 according to the comparative example is a value obtained by dividing the thickness (mm) of the printed substrate 101 by the arrival time (sec) of the comparative example. Each thickness of the printed substrate 1 and the printed substrate 101 is 1.6 mm. As illustrated in FIG. 9B, as the area (mm²) of the exposed portion 4A of the pattern 4 of the printed substrate 1 increases, a molten soldering speed (mm/sec) of the through hole 2 increases.

Figure 9C:
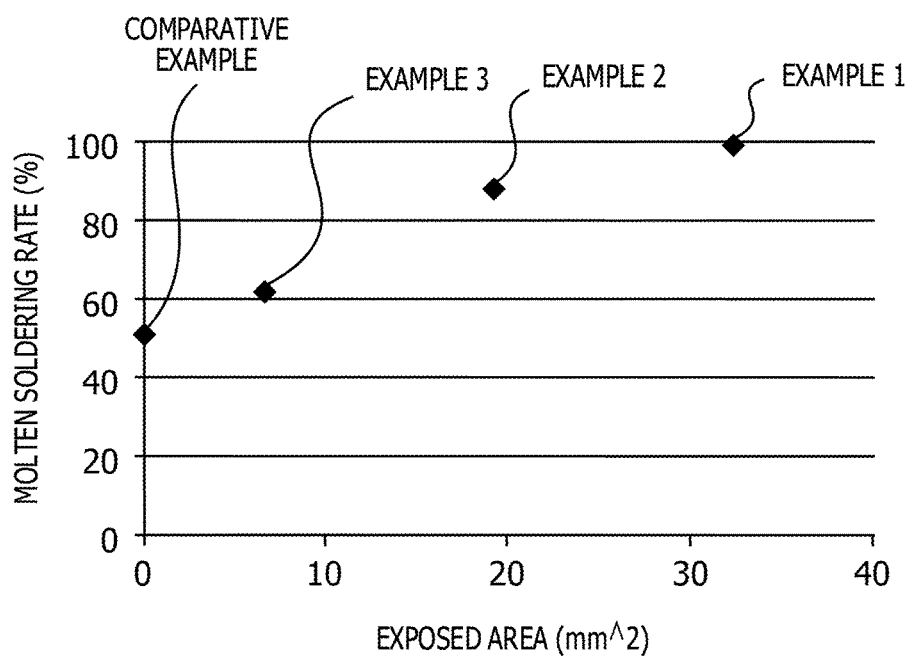
FIG. 9C is a diagram illustrating a relationship between a molten soldering rate and the exposed area.

FIG. 9C is a diagram illustrating the relationship between the molten soldering rate and the exposed area. A vertical axis of FIG. 9C represents the molten soldering rates (%) of the through holes 2 according to Examples 1 to 3 and the molten soldering rate (%) of the through hole 102 according to the comparative example. The molten soldering rates (%) of the through holes 2 according to Examples 1 to 3 are a filling rate (%) of the molten solder 41 in the through hole 2. The molten soldering rate (%) of the through hole 102 according to the comparative example is the filling rate (%) of the molten solder 301 in the through hole 102. The molten soldering rates (%) of the through holes 2 according to Examples 2 and 3 are a relative value when the molten soldering rate of the through hole 2 according to Example 1 is 100%. As illustrated in FIG. 9C, as the area (mm²) of the exposed portion 4A of the pattern 4 of the printed substrate 1 increases, the molten soldering rate (%) of the through hole 2 of the printed substrate 1 increases.

Figure 10:
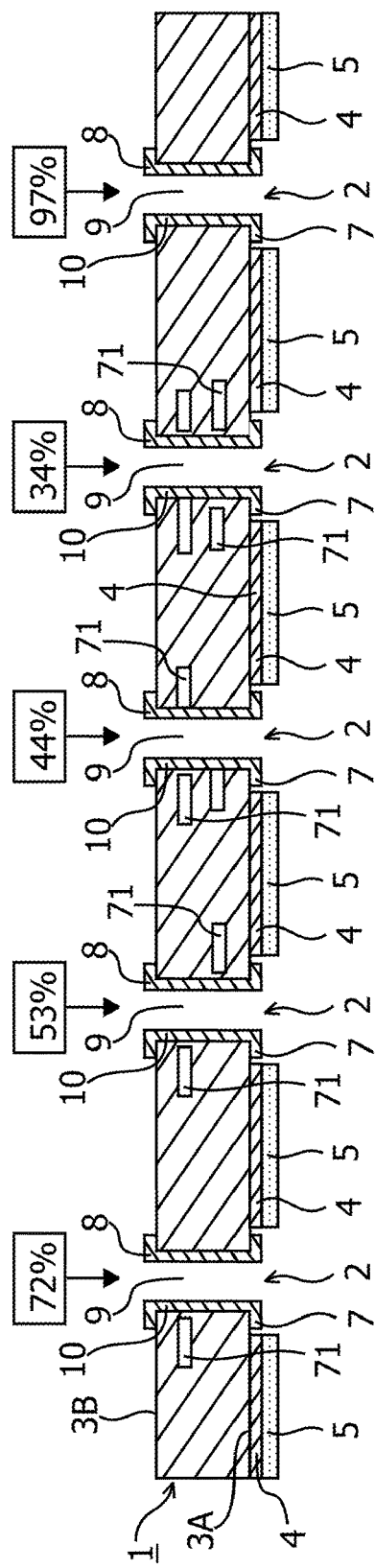
FIG. 10 is a cross-sectional view of the printed substrate.

A plurality of wiring patterns (solid patterns) are formed on the printed substrate 1. When the printed substrate 1 passes through the surface of the molten solder 41, the heat of the molten solder 41 is absorbed and diffused by the wiring pattern. The molten soldering rate of the through hole 2 changes depending on the arrangement of the wiring pattern on the printed substrate 1. For example, the molten soldering rate of the through hole 2 in the vicinity of the wiring pattern is low. Therefore, the area value of the exposed portion 4A of the pattern 4 is determined based on the molten soldering rate of the through hole 2 (hereinafter, referred to as initial wicking rate) in a state where the pattern 4 is not exposed from the solder resist 5. Accordingly, it is possible to selectively improve the molten soldering of the through hole 2. The initial wicking rate may be calculated by simulation at a design stage of the printed substrate 1, or may be measured by preparing a TEG substrate. FIG. 10 is a cross-sectional view of the printed substrate 1. On the printed substrate 1 illustrated in FIG. 10, the initial wicking rate is illustrated. The electronic component 20 and the molten solder 41 are omitted in FIG. 10. In a case where a wiring pattern 71 is arranged in the vicinity of the through hole 2, the initial wicking rate is low. The wiring pattern 71 is provided inside the printed substrate 1 on the printed substrate 1 illustrated in FIG. 10. However, the wiring pattern 71 may be provided on the first surface 3A and the second surface 3B of the printed substrate 1. The wiring pattern 71 is an example of a pattern.

From verification results illustrated in FIGS. 9A to 9C, the Expression (1) below may be derived.

$$Y = 1.5X + \alpha \qquad (1)$$

Y is the molten soldering rate (%) of the through hole 2.
X is the area (mm²) of the exposed portion 4A of the pattern 4.
α is the initial wicking rate (%).

For example, in a case where the area value of the exposed portion 4A of the pattern 4 around the through hole 2 with the initial wicking rate of 53% is determined, when substituting Y=100 and α=53 into Expression (1), X=31.3 (mm²) is satisfied. In this manner, by determining the area value of the exposed portion 4A of the pattern 4 around the through hole 2 having the initial wicking rate of 53% to be 31.3 mm², the molten soldering rate of the through hole 2 is improved to 100%.

As illustrated in FIG. 10, the initial wicking rate varies according to the positional relationship between the through hole 2 and the wiring pattern 71. The positional relationship between the through hole 2 and the wiring pattern 71 includes a distance between the through hole 2 and the wiring pattern 71, a width, a length, a thickness, and the like of the wiring pattern 71 arranged in the vicinity of the through hole 2. Since the initial wicking rate varies according to the positional relationship between the through hole 2 and the wiring pattern 71, the area value of the exposed portion 4A of the pattern 4 around the through hole 2 may be determined based on the positional relationship between the through hole 2 and the wiring pattern 71. As a result, the molten soldering of the through hole 2 may be selectively improved according to the positional relationship between the through hole 2 and the wiring pattern 71.

Figure 11A:
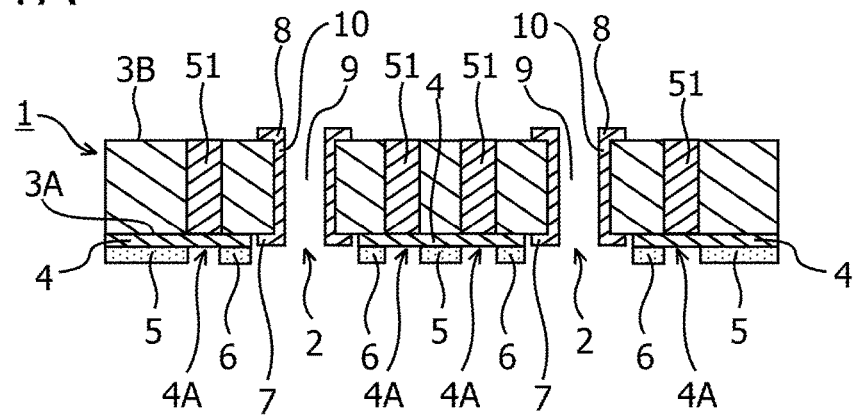
FIG. 11A is a cross-sectional view of the printed substrate.

FIG. 11A is a cross-sectional view of the printed substrate 1. As illustrated in FIG. 11A, a conductor 51 may be provided directly under the exposed portion 4A of the pattern 4 in the printed substrate 1. That is, the conductor 51 may be provided in the printed substrate 1 from the exposed portion 4A of the pattern 4 toward the second surface 3B of the printed substrate 1. The exposed portion 4A of the pattern 4 and the conductor 51 overlap each other in a plan view from the normal direction of the first surface 3A of the printed substrate 1. The conductor 51 is in contact with the exposed portion 4A of the pattern 4. The conductor 51 may penetrate the printed substrate 1. One end of the conductor 51 may contact the exposed portion 4A of the pattern 4, and the other end of the conductor 51 may terminate inside the printed substrate 1. When the printed substrate 1 passes through the surface of the molten solder 41, the heat of the molten solder 41 is transmitted to the inside of the printed substrate 1 through the exposed portion 4A of the pattern 4 and the conductor 51. Therefore, the temperature in the vicinity of the through hole 2 rises. As a result, the molten solder 41 easily rises further inside the through hole 2, and the molten soldering on the printed substrate 1 is further improved. Since the hole is not provided in the exposed portion 4A of the pattern 4 and the cavity is not formed in the inside of the conductor 51, when the printed substrate 1 passes through the surface of the molten solder 41, the molten solder 41 does not enter inside the conductor 51.

Figure 11B:
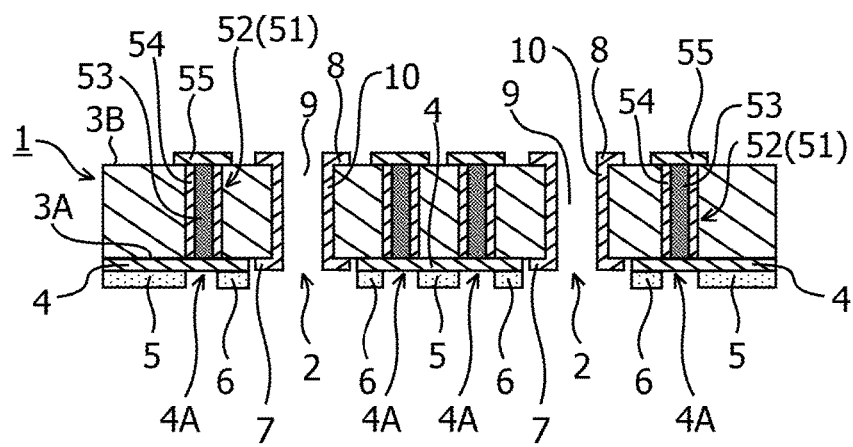
FIG. 11B is a cross-sectional view of the printed substrate.

FIG. 11B is a cross-sectional view of the printed substrate 1. As illustrated in FIG. 11B, the conductor 51 may be a through hole 52 provided in the printed substrate 1. Inside the through hole 52 is filled with a resin 53. The material of the resin 53 may be a resin material with high thermal conductivity. The through hole 52 includes a hole provided in the printed substrate 1 and plating 54 formed on the inner peripheral surface of the hole. A plating 55 for covering the through hole 52 and the resin 53 is formed on the second surface 3B of the printed substrate 1. Since the hole is not provided in the exposed portion 4A of the pattern 4 and the resin 53 is not filled in the inside of the through hole 52, when the printed substrate 1 passes through the surface of the molten solder 41, the molten solder 41 does not enter inside the through hole 52.

For example, the through hole 52 and the resin 53 may be formed in the printed substrate 1 by the following method. First, after a hole is provided in the printed substrate 1, the plating 54 is formed on the inner peripheral surface of the hole of the printed substrate 1 by electrolytic plating or electroless plating. As a result, the through hole 52 is formed in the printed substrate 1. Next, after filling inside the through hole 52 with the resin 53, a plating film is formed on the first surface 3A of the printed substrate 1 by the electrolytic plating or the electroless plating. Next, the plating film on the first surface 3A of the printed substrate 1 is patterned by photolithography and etching to form the pattern 4 on the first surface 3A of the printed substrate 1. Next, the plating film is formed on the second surface 3B of the printed substrate 1 by the electrolytic plating or the electroless plating. Next, the plating film on the second surface 3B of the printed substrate 1 is patterned by the photolithography and the etching to form the plating 55 on the second surface 3B of the printed substrate 1.

Figure 11C:
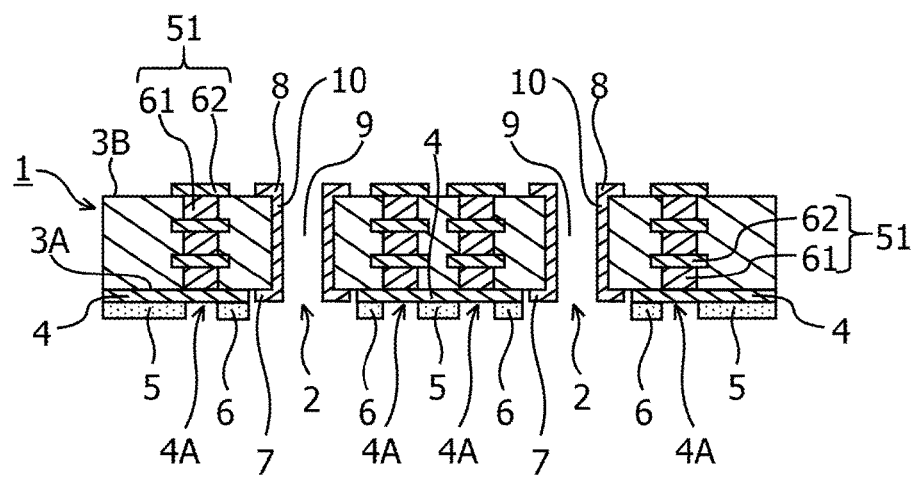
FIG. 11C is a cross-sectional view of the printed substrate.

FIG. 11C is a cross-sectional view of the printed substrate 1. As illustrated in FIG. 11C, the conductor 51 may include the conductor pillar 61 and the conductor pattern 62. The conductor pillar 61 is in contact with the exposed portion 4A of the pattern 4. Since the hole is not provided in the exposed portion 4A of the pattern 4 and the cavity is not formed in the inside of the conductor pillar 61, when the printed substrate 1 passes through the surface of the molten solder 41, the molten solder 41 does not enter inside the conductor pillar 61. For example, the conductor pillar 61 and the conductor pattern 62 may be formed on the printed substrate 1 by the following method. First, after providing the hole in the prepreg, filling the hole of the prepreg with a conductive paste, the conductor pillar 61 is formed on the prepreg. Next, the conductor pattern 62 is formed on both sides of the prepreg. By stacking the plurality of prepregs, the conductor pillar 61 and the conductor pattern 62 are formed on the printed substrate 1.

Figure 12:
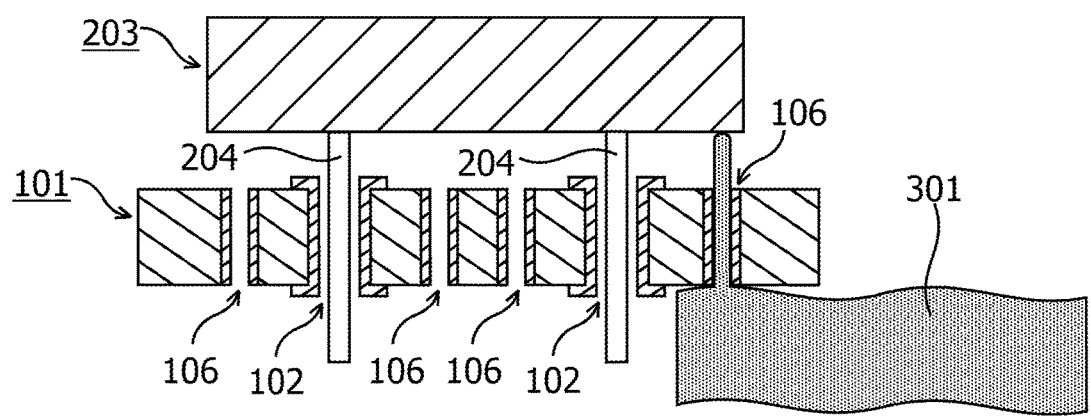
FIG. 12 is a cross-sectional view of the printed substrate according to the comparative example.
Figure 13A:
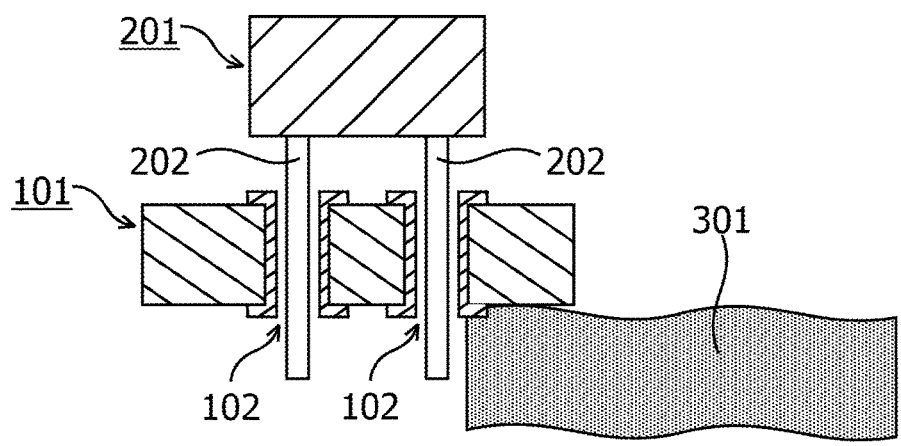
FIG. 13A is a cross-sectional view of the printed substrate according to the comparative example.
Figure 13B:
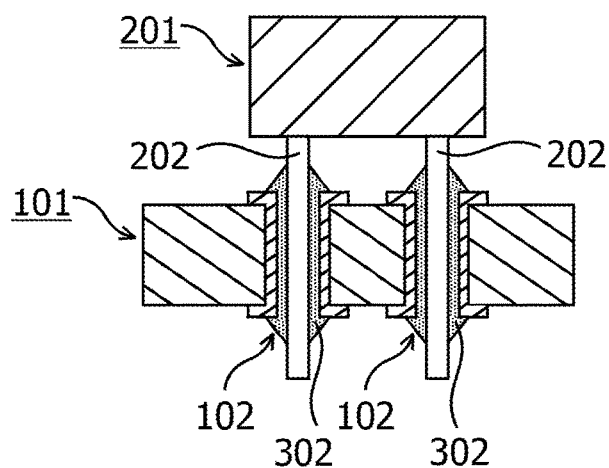
FIG. 13B is a cross-sectional view of the printed substrate according to the comparative example.

FIG. 12 is a cross-sectional view of the printed substrate 101 according to a comparative example. A lead terminal 204 of a large size electronic component 203 is inserted in the through hole 102 of the printed substrate 101 illustrated in FIG. 12. In the printed substrate 101 illustrated in FIG. 12, a through via 106 is provided around the through hole 102. The inside of the through via 106 is hollowed, and when the printed substrate 101 passes through the surface of the molten solder 301, the molten solder 301 enters the through via 106. As the molten solder 301 enters the through via 106, the temperature in the vicinity of the through hole 102 rises. However, since the through via 106 has an opening on the side of the electronic component 203, the molten solder 301 that is entered the through via 106 leaks out to the electronic component 203 side. Accordingly, the molten solder 301 comes into contact with the electronic component 203.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A substrate on which an electronic component is soldered, comprising:
   an electronic component;
   a through hole positioned on the substrate and passing through the substrate;
   a solder that joins the through hole and a terminal of the electronic component inserted in the through hole;
   a pattern formed on a first surface of the substrate, the first surface facing a second surface on which the electronic component is placed;
   a first resist formed on the pattern around the through hole;
   a second resist formed on the pattern apart from the first resist; and
   an exposed portion of which the pattern is exposed between the first resist and the second resist.

2. The substrate on which an electronic component is soldered according to claim 1, further comprising:
   a conductor positioned inside the substrate from the exposed portion toward the second surface.

3. The substrate on which an electronic component is soldered according to claim 1, wherein the pattern is also formed in the substrate, and wherein an area value of the exposed portion is based on a positional relationship between the through hole and the pattern.

4. An electronic device comprising:

a substrate;

an electronic component mounted on the substrate; and a through hole positioned on the substrate and passing through the substrate, the substrate includes solder for joining the through hole and a terminal of the electronic component inserted in the through hole, a pattern formed on a first surface of the substrate, the first surface facing a second surface on which the electronic component is placed, a first resist formed on the pattern around the through hole, a second resist formed on the pattern apart from the first resist, and an exposed portion of which the pattern is exposed between the first resist and the second resist.

5. A method of soldering an electronic component comprising:

placing an electronic component on a second surface facing a first surface of a substrate including a through hole positioned on the substrate and passing through the substrate, a pattern formed on the first surface of the substrate, a first resist formed on the pattern around the through hole, a second resist formed on the pattern apart from the first resist, and an exposed portion of which the pattern is exposed between the first resist and the second resist, and inserting a terminal of the electronic component to the through hole of the substrate; and bringing the first surface of the substrate into contact with a molten solder and soldering the terminal to the through hole.

* * * * *